United States Patent [19]

Komoto et al.

[11] Patent Number: 5,327,326
[45] Date of Patent: Jul. 5, 1994

[54] LARGE SCALE INTEGRATED PACKAGE STRUCTURE

[75] Inventors: Mitsuo Komoto; Hiroshi Endoh, both of Tokyo, Japan

[73] Assignees: NEC Corporation; Japan Aviation Electronics Industry Limited, both of Tokyo, Japan

[21] Appl. No.: 98,771

[22] Filed: Jul. 29, 1993

[30] Foreign Application Priority Data

Jul. 30, 1992 [JP] Japan ............................ 4-223346

[51] Int. Cl.$^5$ .................. H05K 7/02; H01R 23/68; H01R 29/00
[52] U.S. Cl. .................. 361/760; 361/761; 361/785; 361/791; 439/44; 439/46
[58] Field of Search .............. 439/44, 45, 46, 47, 439/48, 50, 52, 53, 63, 74–75; 361/729, 730, 736, 760, 761, 762, 763, 764, 785, 786, 787, 790–792; 174/260–262; 257/690–691

[56] References Cited

U.S. PATENT DOCUMENTS

| | | | |
|---|---|---|---|
| 3,027,534 | 3/1962 | Deakin | 439/46 |
| 4,039,902 | 8/1977 | Lacan et al. | 361/760 |
| 4,567,654 | 2/1986 | Kloenne et al. | 439/45 |
| 5,073,124 | 12/1991 | Powell | 361/785 |

OTHER PUBLICATIONS

T. Watari and A. Dohya, "High Performance Packaging Technology for Supercomputers", IEICE Transactions, vol. E 74, No. 8, Aug. 1991, pp. 2331-2336.

Primary Examiner—Leo P. Picard
Assistant Examiner—Bot Ledynh
Attorney, Agent, or Firm—Sughrue, Mion, Zinn, Macpeak & Seas

[57] ABSTRACT

An LSI package structure with high efficiency of the power supply and fast transmission of the signal is provided in which: adjacent to a pin 8 side surface of an LSI package 1, a power supply member 2 having an electrically conductive portions 6 and 7 for power supply bus and ground bus respectively, and a flexible interconnection board 3 having a power supply pattern layer 3b and a ground pattern layer 3a connected to the portions 6 and 7 respectively via a pin 9, are disposed; the pins 8 and 9 each extend through a through hole 3c formed on the interconnection board 3, the power supply pattern layer 3b and the pins 8 and 9 for power supply being interconnected within the through hole, the ground pattern layer 3a and the pins 8 and 9 for grounding being interconnected within the through hole; and the signal input/output pin 8 and a connector 5 of a signal input/output coaxial cable 5a are interconnected at the side of the interconnection board 3 oppsite the LSI package 1.

11 Claims, 5 Drawing Sheets

LARGE SCALE INTEGRATED PACKAGE STRUCTURE

FIELD OF THE INVENTION

The present invention relates to an LSI package structure and, in particular, to an LSI package structure paying special attention to the reduction of voltage drop in the power supply path and the rapid transmission of the signal. The LSI package structure according to the present invention can be applied to form, for example, the electronic circuit of electronic calculator.

BACKGROUND OF THE INVENTION

A specific example of a conventional LSI package structure is shown in FIG. 1.

In FIG. 1, a plurality of LSIs 56 are loaded on the upper surface of a common ceramic substrate 55, and a plurality of pins 57 are protruded on the lower surface of the substrate 55. These pins 57 comprise a signal input/output terminal, a power supply terminal and a ground terminal for the LSI 56. Thus, an LSI package 50 is constituted. The LSI package is described in, for example, "IEICE TRANSACTIONS, VOL. E74, NO. 8, AUGUST 1991, PP 2331-3336".

The LSI package 50 is packaged on a multilayer printed interconnection board 51 by using a multipolar connector 52. To the multipolar connector 52, a plurality of sockets 53 which are each fitted with the pin 57 of the LSI package 50 are provided, and lead pins 54A through 54C extending downwardly are each connected to the socket 53. The foregoing pins 57 are each inserted through the socket 53 to achieve electrical and mechanical connection between the LSI package 50 and the multipolar connector 52. The printed interconnection board 51 comprises a power supply pattern layer 61, a signal pattern layer 62 and a ground pattern layer 63 and, further, a through hole 64 at an appropriate position. The foregoing pattern layers 61 through 63 are each made through by any of the through holes 64. The foregoing lead pins 54A through 54C are inserted through the through hole 64 to thereby achieve electrical and mechanical connection between the multipolar connector 52 and the printed interconnection board 51. Here the lead pin 54A is connected to the power supply pattern layer 61 connected to the power source, the lead pin 54B to the ground pattern layer 63 and the lead pin 54C to the signal pattern layer 62, respectively. Further, to the lead pin 54C, a cable connector 58 is connected for the input/output of the signal from and to the exterior.

In the package structure arranged as above, power supply to the LSI 56 is achieved from the power supply pattern layer 61 and the ground pattern layer 63 of the printed interconnection board 51 through the lead pins 54A, 54B and the socket 53 and the pin 57. Further, input and output of the signal to and from each LSI are achieved through the pin 57, socket 53, signal pattern layer 62 of the printed interconnection layer 51 and the cable connector 58.

Incidentally, recently, as the LSI loaded on the LSI package is highly integrated, its power consumption also tends to increase. In consequence, in the power supply system according to the foregoing conventional package structure, a need arises to increase the number of the power supply pattern layer 61 and the ground pattern layer 63 of the printed interconnection board 51, and the aspect ratio (board thickness/through hole diameter) is increased to make it difficult to manufacture the printed interconnection board. Further, since the current passes through the printed interconnection board 51, socket 53 and pin 57 over a long distance, the voltage drop can be increased. Still further, in terms of signal transmission, the transmission line is made very longer because it comprises the pin 57, socket 53, lead pin 54C and the cable connector 58, while it passes through the multipolar connector 52, which causes impedance discontinuity resulting in reduction of the transmission speed of the signal.

SUMMARY OF THE INVENTION

In view of the foregoing, an object of the present invention is to provide an LSI package structure which is capable of reducing the voltage drop of the power supply path.

Another object of the present invention is to provide an LSI package structure which is capable of transmitting signal at a fast speed.

According to the present invention, in order to achieve the foregoing end, there is provided an LSI package structure in which:

an LSI package is provided, the LSI package comprising a substrate, at least one LSI loaded on one surface of the substrate, and a power supply pin, ground pin and a signal input/output pin for the LSI protruded on the other surface of the substrate;

adjacent to a pin side surface of the LSI package, a power supply member having an electrically conductive portion for power supply bus and an electrically conductive portion for ground bus, and an interconnection board having a power supply pattern layer and a ground pattern layer connected to the electrically conductive portion for the power supply bus and the electrically conductive portion for the ground bus respectively, are disposed;

the power supply pin, ground pin and signal input/output pin each extend through a through hole formed on the interconnection board, the power supply pattern layer and the power supply pin being interconnected within the through hole, the ground pattern layer and the ground pin being interconnected within the through hole; and at the side of the interconnection board oppsite the LSI package, the signal input/output pin and a signal input/output cable are interconnected.

In order to connect the power supply pattern layer and the power supply pin as well as connect the ground pattern layer and the ground pin, a socket may be mounted to the through hole. Or these connections may be achieved by soldering the power supply pin and the ground pin to the through hole.

The power supply member may be formed into the form of a grating, and faced with each opening of the grating, the electrically conductive portion for the power bus and the electrically conductive portion for the ground bus may be provided, to which an electrically conductive pin may be attached by means of which, in the same manner in which the power supply pattern layer and the power supply pin and the ground pattern layer and the ground pin respectively are connected, the power supply pattern layer and the pin of the electrically conductive portion for the power supply bus may be connected while the ground pattern layer and the pin of the electrically conductive portion for the ground bus may be connected.

As the interconnection board, a flexible interconnection board may preferably be used.

At the side of the interconnection board opposite the LSI package, an electrically conductive member may be disposed, the electrically conductive member having cavities for receiving the power supply pin, ground pin and the signal input/output pin at the positions corresponding thereto; the internal surfaces of the cavities may be electrically interconnected. The cavity for receiving the signal input/output pin may be made through, a connector for signal input/output coaxial cable being inserted within the through hole, a core conductor of the cable for signal transmission being connected to the signal input/output pin, a shield conductor of the cable being connected to the internal surface of the through hole, an interconnecting member for electrically interconnecting the ground pin and the internal surface of the cavity for receiving the ground pin being disposed within the cavity.

In the present invention as described above, since the power is supplied to the LSI package from the electrically conductive portion for the power supply bus of the power supply member via the power supply pattern layer and the power supply pin, the voltage drop is small enough, so that a large current can be supplied with high efficiency while since the signal is entered to and emitted from the signal input/output cable by directly connecting the signal input/output pin, discontinuity of the impedance is small, and the rapid transmission of the signal becomes possible.

DESCRIPTION OF THE PREFERRED EMBODIMENTS

A specific embodiment of the present invention is hereinafter described with reference to the accompanying drawings.

FIGS. 2 through 5 illustrate a specific embodiment of the LSI package structure according to the present invention. In this embodiment, a plurality of LSIs 11 are loaded on the upper surface of a common ceramic substrate 10 and, on the lower surface of the substrate 10, a plurality of pins 8 are protruded for entering and emitting the signal, or for connecting to the power source or for grounding. Thus, the LSI package is completed.

Figure 1:
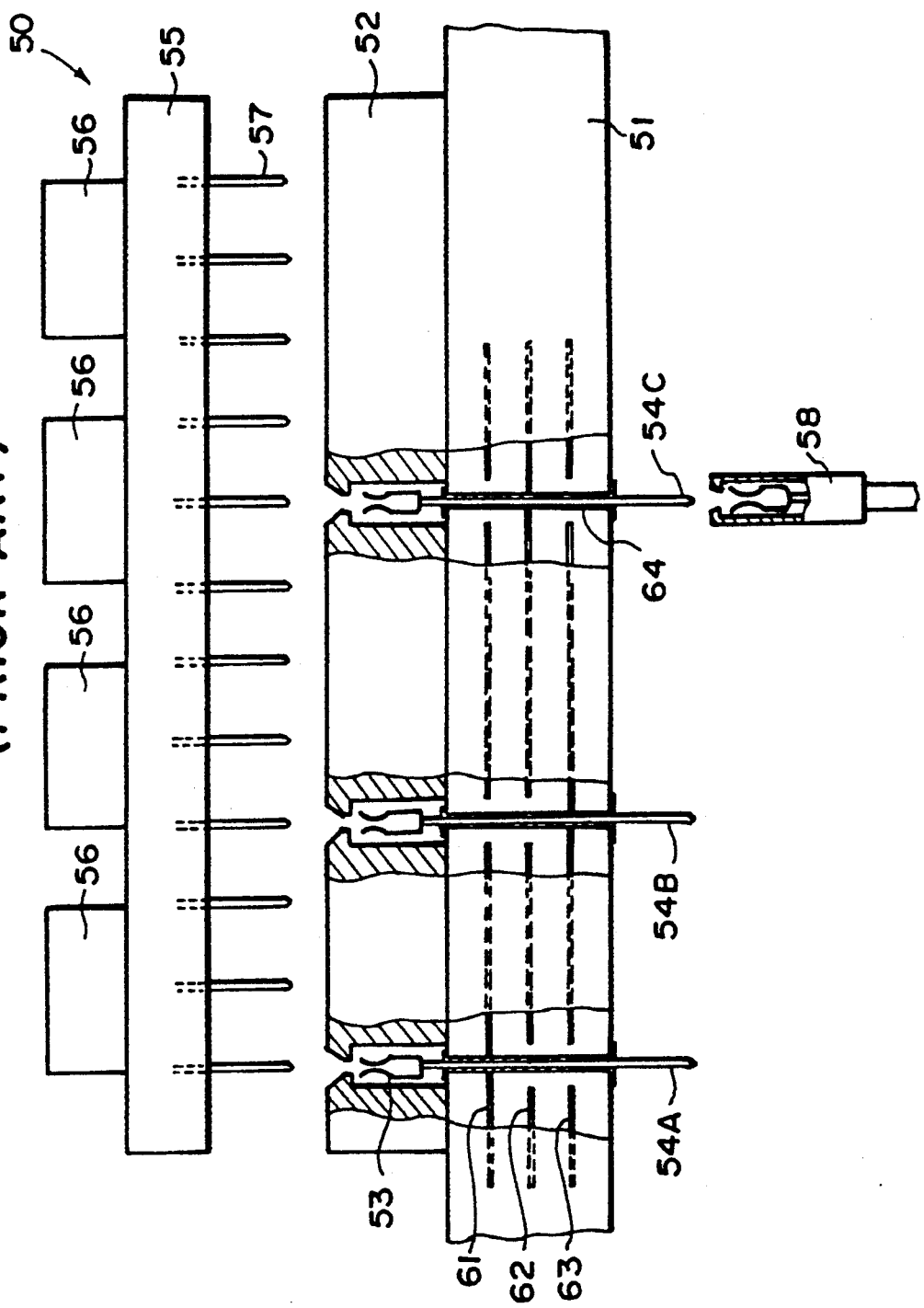
FIG. 1 is a view of a specific embodiment of a conventional LSI package structure.
Figure 2:
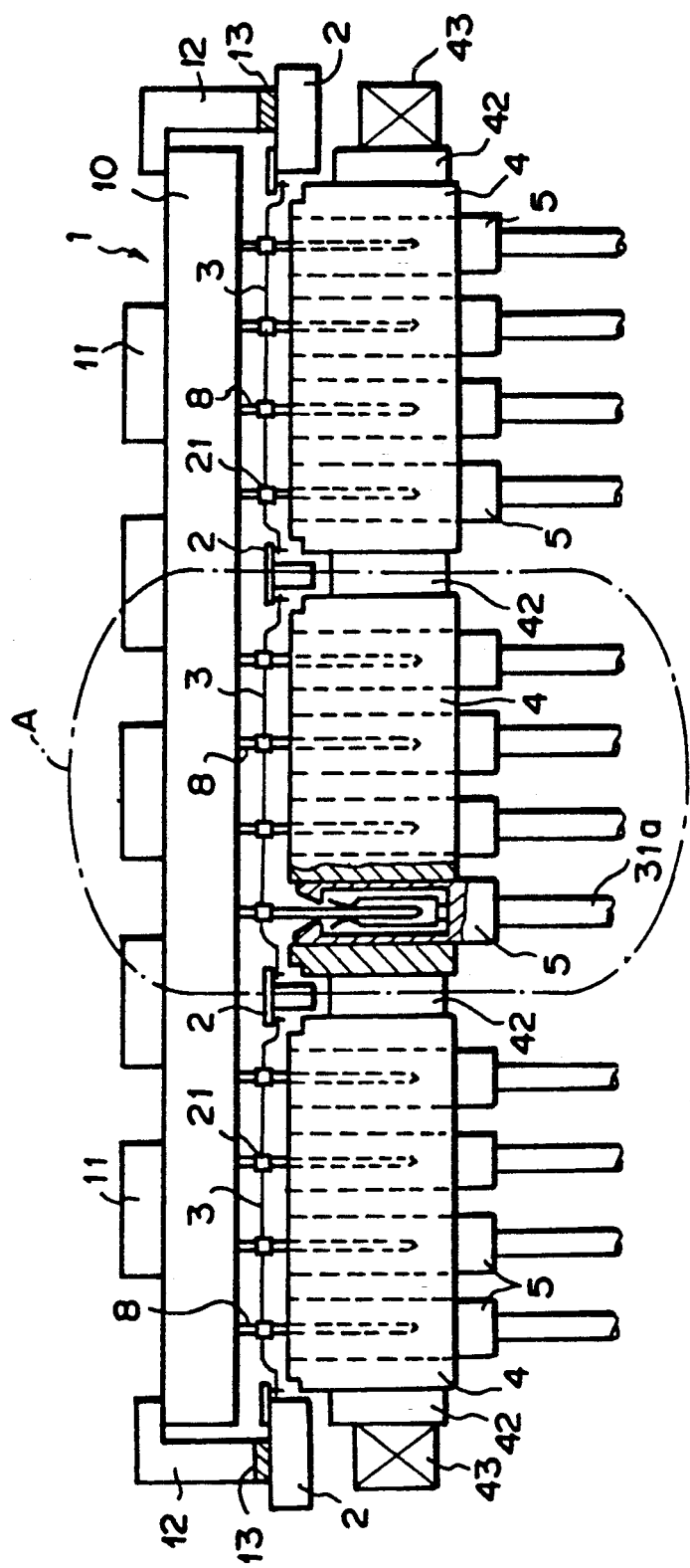
FIG. 2 is a view of a specific embodiment of an LSI package structure according to the present invention.
Figure 3:
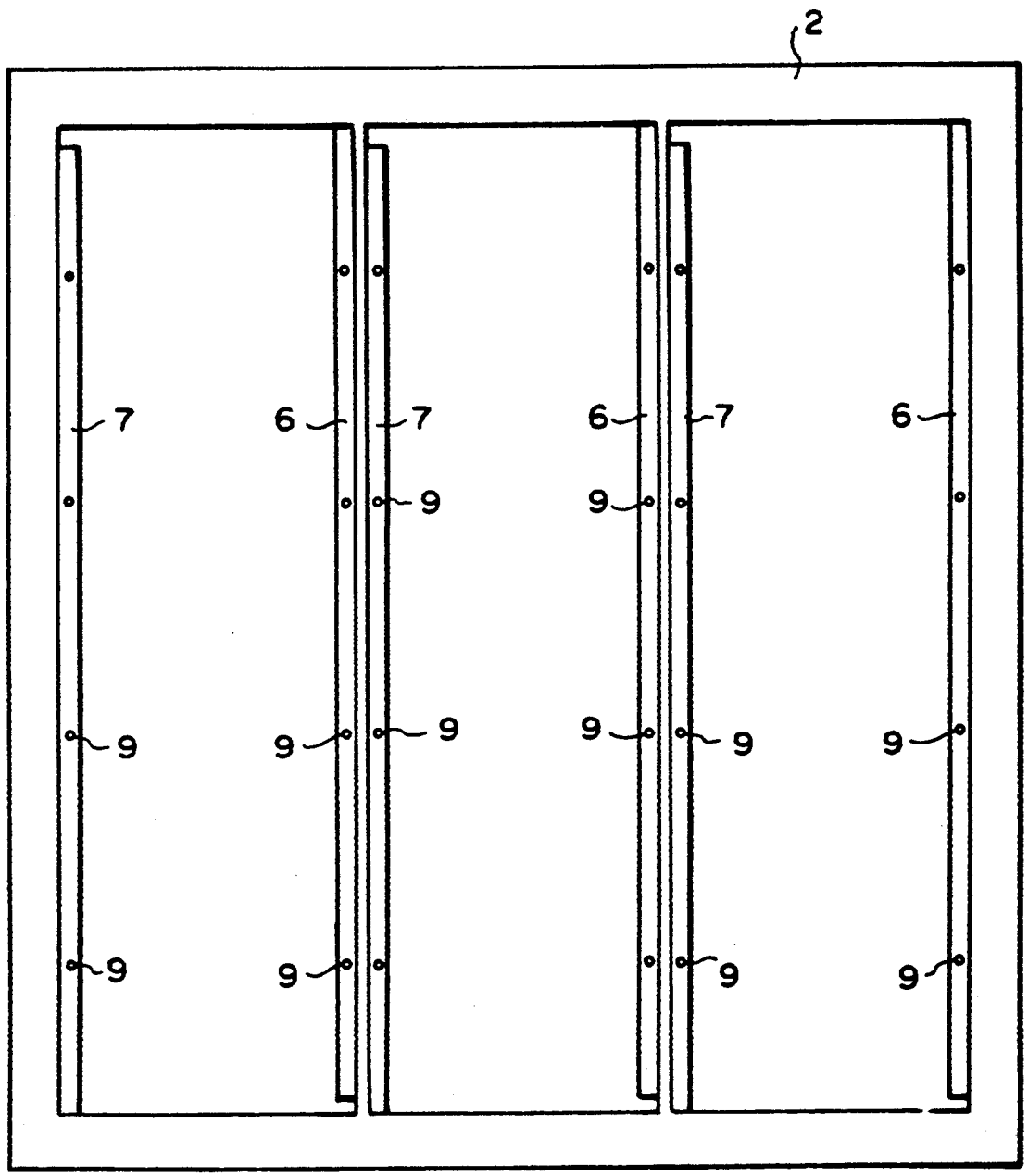
FIG. 3 is a bottom view of a power supply member for the embodiment of the LSI package structure according to the present invention.
Figure 4:
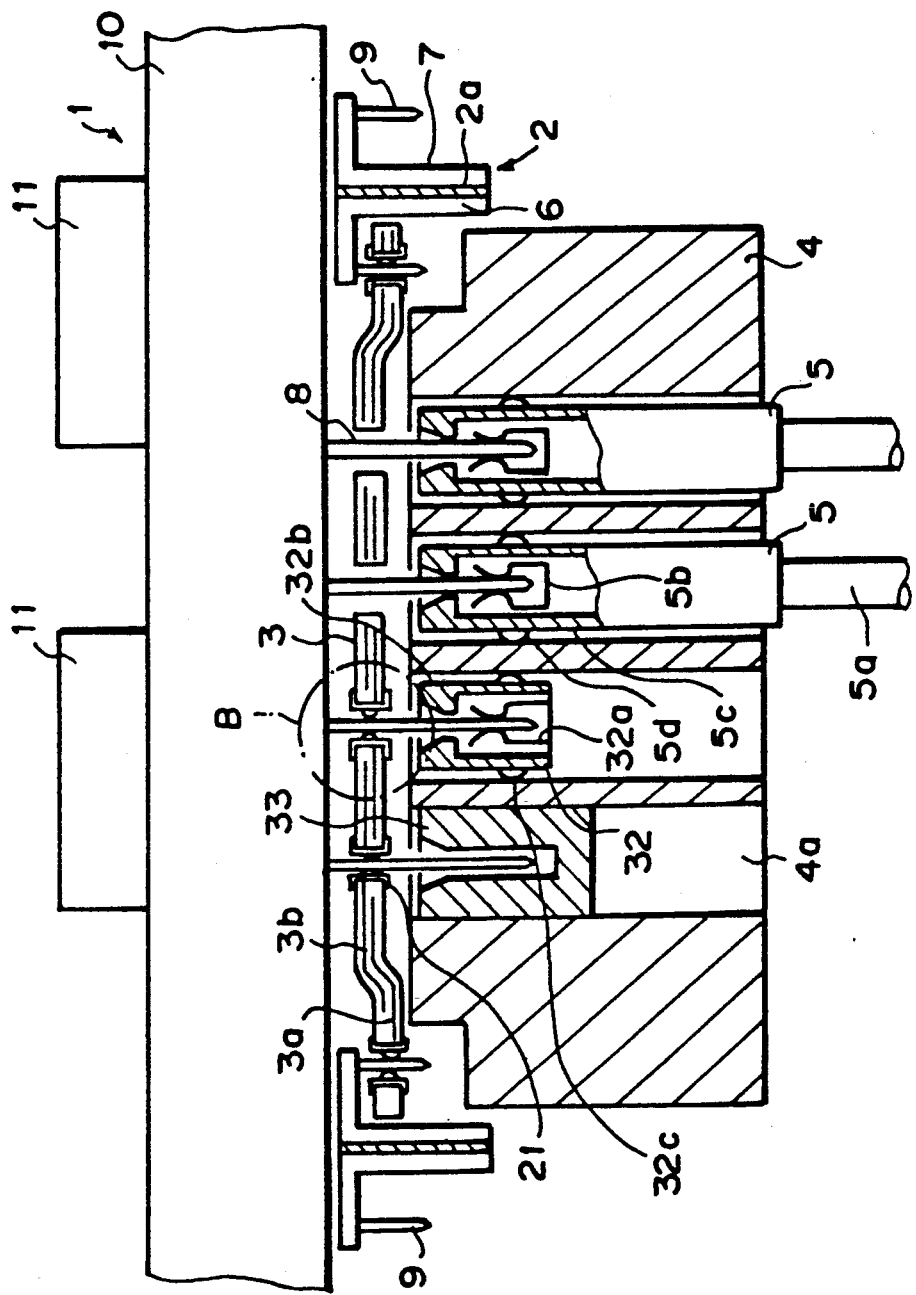
FIG. 4 is an enlarged view of the A portion of FIG. 2.

A support member 12 is mounted at the outer peripheral portion of the ceramic substrate 10, and the support member 12 has a perpendicular portion extending downwardly along the outer peripheral surface of the substrate 10, and a power supply member 2 is mounted at the lower end portion of the perpendicular portion via the insulating member 13. The power supply member 2 has the form of a grating as illustrated in FIG. 3. The power supply member 2, as shown in FIG. 4, comprises a laminar body of an insulating portion 2a and electrically conductive portions 6, 7. The electrically conductive portion 6 forms a power supply bus connected to the power source, and the electrically conductive portion 7 constitutes a ground bus. As shown in FIG. 3, the electrically conductive portion 6 is located at one longer side of either one of the openings of the grating-shaped power supply member 2, and the electrically conductive portion 7 is located at the other longer side. On these electrically conductive portions 6, 7, pins 9 are protruded downwardly at appropriate intervals.

Figure 5:
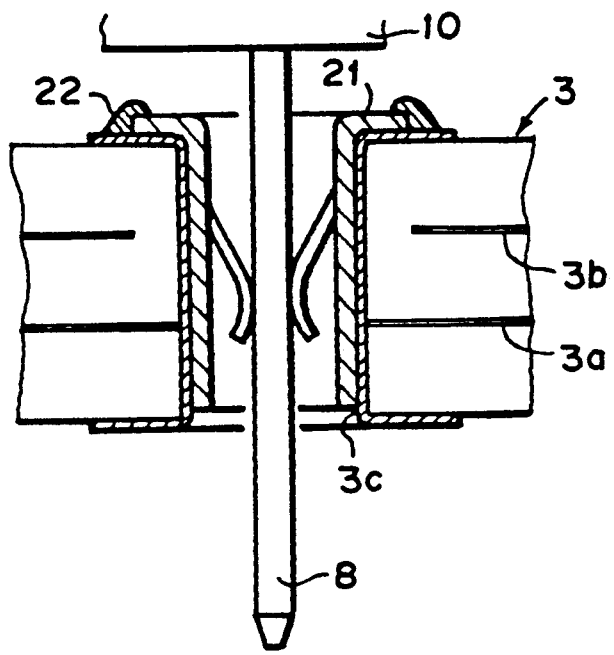
FIG. 5 is an enlarged view of the B portion of FIG. 4.

A flexible printed interconnection board 3 is disposed at each opening of the grating-shaped power supply member 2. The interconnection board 3 is attached to the pins 8, 9. The interconnection board 3 has a ground pattern layer 3a and a power supply pattern layer 3b and, further, a through hole 3c is formed at the position corresponding to the pins 8, 9. A socket 21 is mounted to the through hole 3c at the position corresponding to the power supply pin 8, ground pin 8 and the pin 9 by means of a solder 22. In consequence, as shown in FIGS. 4 and 5, the ground pin 8 and the ground pattern layer 3a are electrically connected via the socket 21. Likewise, the power supply pin 8 and the power supply pattern layer 3b are electrically connected via the socket 21, the pin 9 of the electrically conductive portion 6 for the power supply bus and the power supply pattern layer 3b are electrically connected via the socket 21, and the pin 9 of the electrically conductive portion 7 for the ground bus and the ground pattern layer 3a are electrically connected via the socket 21.

Downwardly of each interconnection board 3, an electrically conductive member 4 rigidly retained by a retainer member 42 is disposed. The retainer member 42 is mounted to a frame 43. The electrically conductive member 4 has a plurality of through holes 4a extending vertically. These through holes are disposed at the position corresponding to the pin 8, where the tip portion of the pin 8 is inserted from above. The electrically conductive member 4 may be made of an electrically conductive material such as metal or the like in its entirety, or may be made by forming an electrically conductive film on the surface of an insulating material such as plastic or the like, or may be made by incorporating pieces of electrically conductive material such as metal or the like within the insulating material such as plastic or the like. Thus, the internal surfaces of the through holes 4a are made electrically connected to each other.

A coaxial cable connector 5 inserted from below through the through hole 4a is adapted to the signal input/output pin 8. This connector 5 is mounted to the tip end of the coaxial cable 5a. The signal transmission core conductor (not shown) of the coaxial cable 5a is connected to a tulip-shaped central contacting member 5b of the connector 5, and a shield conductor (not shown) of the coaxial cable 5a is connected to the cylindrical outer conductor 5c of the connector 5. The connector 5 has an outer contacting member 5d on the outer surface of the outer conductor 5c, and the contacting member 5d comes in contact with the internal surface of the through hole 4a by spring force to achieve electrical connection.

Within the through hole 4a corresponding to the ground pin 8, a ground contacting member 32 is fitted. This ground contacting member 32 has a central contacting member 32a adapted to the pin 8 while having an outer conductor 32b, and both of them 32a, 32b are electrically connected to each other. The ground contacting member 32 has an outer contacting member 32c on the outer surface of the outer conductor 32b, and the contacting member 32c comes in contact with the inner surface of the through hole 4a by spring force to achieve electrical connection. Thus, the shield conductor of the coaxial cable 5a is electrically connected to the ground pin 8 via the electrically conductive member 4.

Within the through hole 4a corresponding to the power supply pin 8, a cap 33 made of an insulating material is fitted to prevent contact between the inner surface of the throgh hole and the power supply pin 8.

In the foregoing embodiment, the power supply to the LSI 11 is achieved from the electrically conductive portion 6 for the power supply bus of the power supply member 2, which is connected to the power source (not shown), via the pin 9, power supply pattern layer 3b of the interconnection board 3 and the power supply pin 8. Since the impedance of the power supply member 2 can be made low enough, the resulting voltage drop is small enough while since the current is immediately supplied from here to the power supply pin 8 via only each interconnection board 3, the overall voltage drop is small. Since the input and output of the signal is achieved by directly connecting the signal input/output pin 8 to the cable connector 5, discontinuity of the impedance may be small and the signal transmission time may be short.

Figure 6:
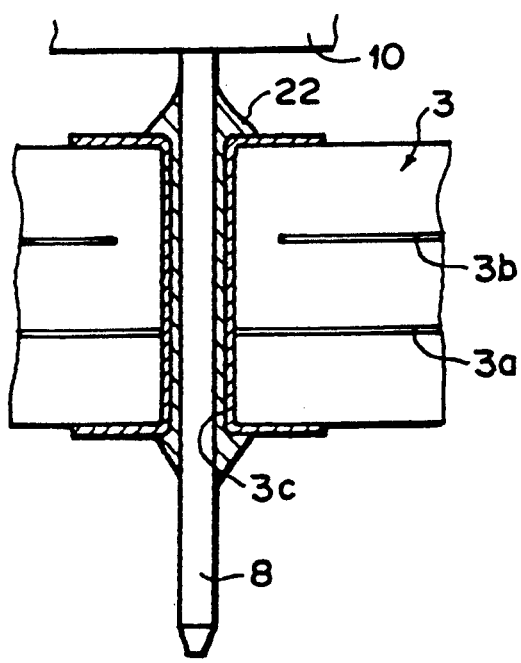
FIG. 6 is a view of a modification of the interconnection between the pin and the through hole of the interconnection board according to the embodiment of the LSI package structure of the present invention, the view illustrating a similar portion as in FIG. 5.

FIG. 6 illustrates a modification of the connection between the pin 8 and the through hole 3c of the interconnection board 3 in the foregoing embodiment. As shown, in this modification, the pin 8 is directly connected to the through hole 3c by means of soldering.

The present invention is not restricted to the foregoing embodiments, but various changes and modifications are possible within the scope and spirit of the present invention defined in claims.

What is claimed is:

1. LSI package structure in which:
   an LSI package is provided, said LSI package comprising a substrate, at least one LSI loaded on one surface of said substrate, and a power supply pin, a ground pin and a signal input/output pin for said LSI protruded on the other surface of said substrate;
   adjacent to a pin side surface of said LSI package, a power supply member having an electrically conductive portion for power supply bus and an electrically conductive portion for ground bus, and an interconnection board having a power supply pattern layer and a ground pattern layer connected to said electrically conductive portion for the power supply bus and said electrically conductive portion for the ground bus respectively, are disposed;
   said power supply pin, said ground pin and said signal input/output pin each extend through a through hole formed on said interconnection board, said power supply pattern layer and said power supply pin being interconnected within said through hole, said ground pattern layer and said ground pin being interconnected within said through hole; and
   at the side of said interconnection board opposite said LSI package, said signal input/output pin and a signal input/output cable are interconnected.

2. LSI package structure as set forth in claim 1 wherein said power supply pattern layer and said power supply pin are interconnected via a socket attached to said through hole, and said ground pattern layer and said ground pin are interconnected via a socket attached to said through hole.

3. LSI package structure as set forth in claim 1 wherein said power supply pattern layer and said power supply pin are interconnected by soldering said power supply pin to said through hole, and said ground pattern layer and said ground pin are interconnected by soldering said ground pin to said through hole.

4. LSI package structure as set forth in claim 1 wherein said power supply member takes the form of a grating, and at one of two opposed sides of each opening of said power supply member, said electrically conductive portion for the power supply bus is provided while, at the other side, said electrically conductive portion for the ground bus is provided, an electrically conclusive pin being attached to each of these electrically conductive portions, said electrically conductive pin extending through a through hole formed at the corresponding position of said interconnection board, said power supply pattern layer and the pin of the electrically conductive portion for the power supply bus being interconnected within the through hole while said ground pattern layer and the pin of the electrically conductive portion for the ground bus being interconnected within the through hole.

5. LSI package structure as set forth in claim 4 wherein said power supply pattern layer and said pin of the electrically conductive portion for the power supply bus are interconnected via a socket attached to said through hole, and said ground pattern layer and said pin of the electrically conductive portion for the ground bus are interconnected via a socket attached to said through hole.

6. LSI package structure as set forth in claim 4 wherein said power supply pattern layer and said pin of the electrically conductive portion for the power supply bus are interconnected by soldering said pin of the electrically conductive portion for the power supply bus to said through hole, and said ground pattern layer and said pin of the electrically conductive portion for the ground bus are interconnected by soldering said pin of the electrically conductive portion for the ground bus to said through hole.

7. LSI package structure as set forth in claim 1 wherein said interconnection board comprises a flexible one.

8. LSI package structure as set forth in claim 1 wherein at the side of said interconnection board opposite said LSI package, an electrically conductive member is disposed, said electrically conductive member having cavities for receiving said power supply pin, ground pin and said signal input/output pin at the positions corresponding thereto; at least the internal surface of the cavity for receiving said signal input/output pin and the internal surface of the cavity for receiving said ground pin are electrically connected; said cavity for receiving the signal input/output pin is made through, a connector for signal input/output coaxial cable being inserted within said through hole, a core conductor of the cable for signal transmission being connected to said signal input/output pin, a shield conductor of the cable being connected to the internal surface of said through hole, an interconnecting member for electrically interconnecting said ground pin and said internal surface of the cavity for receiving the ground pin being disposed within the cavity.

9. LSI package structure as set forth in claim 8 wherein an insulating member is disposed within said cavity for receiving said power supply pin to prevent contact between the pin and said internal surface of the cavity.

10. LSI package structure as set forth in claim 1 wherein said power supply member is supported via an insulating member by means of a support member mounted at the outer peripheral portion of said substrate of the LSI package.

11. LSI package structure as set forth in claim 4 wherein said interconnection board is supported by connection between said power supply pattern layer and said power supply pin within said through hole, connection between said ground pattern layer and said ground pin within said through hole, connection between said power supply pattern layer and said pin of electrically conductive portion for the power supply bus within said through hole and by connection between said ground pattern layer and said pin of electrically conductive portion for the ground bus within said through hole.

* * * * *